United States Patent [19]

McElroy

[11] Patent Number: 4,701,885

[45] Date of Patent: Oct. 20, 1987

[54] DYNAMIC MEMORY ARRAY WITH QUASI-FOLDED BIT LINES

[75] Inventor: David J. McElroy, Houston, Tex.

[73] Assignee: Texas Instruments Incorporated, Dallas, Tex.

[21] Appl. No.: 634,899

[22] Filed: Jul. 26, 1984

[51] Int. Cl.[4] .............................................. G11C 11/40
[52] U.S. Cl. ..................................... 365/189; 365/230
[58] Field of Search ..................... 365/189, 230, 63, 51

[56] References Cited

U.S. PATENT DOCUMENTS

4,301,518 11/1981 Klaas ..................................... 365/207
4,494,220 1/1985 Dumbri et al. ....................... 365/200

Primary Examiner—Terrell W. Fears
Attorney, Agent, or Firm—John G. Graham

[57] ABSTRACT

A semiconductor dynamic read/write memory device contains an array of rows and columns of one-transistor memory cells, with a differential sense amplifier for each column of cells. The sense amplifier has a pair of balanced bit lines extending from its inputs, in a quasi-folded bit line configuration. The memory cells are not directly connected to the bit lines, but instead are coupled to bit line segments. The row address selects a cell to be connected to a segment, and also selects one of the two segments to be connected to one of the two bit lines. Instead of being interleaved one-for-one, the word lines for cells to be connected to the two bit lines are in groups one group for each segment line; the groups are interleaved. The combined segment line and bit line capacitance has a more favorable ratio to the storage capacitance, compared to the one-for-one interleaved layout.

20 Claims, 13 Drawing Figures

DYNAMIC MEMORY ARRAY WITH QUASI-FOLDED BIT LINES

RELATED CASES

This application discloses subject matter also disclosed in copending applications Ser. No. 626,791, filed July 2, 1984 now U.S. Pat. No. 4,630,240; Ser. No. 630,507, filed July 11, 1984, now U.S. Pat. No. 4,658,382; Ser. No. 634,898, filed July 26, 1984; Ser. No. 636,941, filed Aug. 2, 1984; Ser. No. 640,716, filed Aug. 14, 1984; and Ser. No. 640,717, filed Aug. 14, 1984 now U.S. Pat. No. 4,654,827; all assigned to Texas Instruments.

BACKGROUND OF THE INVENTION

This invention relates to semiconductor memory devices, and more particularly to an improved bit line and cell array structure for dynamic read/write memory devices.

Dynamic MOS read/write memory devices have been constructed generally as shown in U.S. Pat. No. 4,081,701 (a 16K dynamic RAM) issued to White, McAdams, and Redwine, or U.S. Pat. No. 4,293,993 (a 64K dynamic RAM) issued to McAlexander, White and Rao, both assigned to Texas Instruments. Improvements in photolithography and semiconductor processing have made possible the 256K DRAM which is now available, and the 1-Megabit DRAM, now in development. All of these devices use a one-transistor storage cell in which the data is stored in a capacitor. In the devices of higher density, detecting the stored charge becomes more difficult because the cells are smaller and the bit line longer, with more cells per bit line. A reliable signal cannot be detected by a differential sense amplifier when the ratio is less than about 1/30 or 1/40; preferably the ratio is in the area of 1/20 or less.

Instead of the "open" bit line layout of U.S. Pat. Nos. 4,081,701 and 4,293,993, the two bit lines for a given sense amplifier may be folded to lie adjacent one another on the face of the chip. In this manner, localized noise introduced into the substrate, as by alpha particles, for example, will be coupled equally to both bit lines and so will not affect the differential input to the sense amplifier. This folded bit line configuration can be detrimental to the capacitance ratio between storage capacitors and bit lines however, for some cell layouts, because the bit lines must be longer to accomodate twice the number of row lines on one side of a sense amplifier. That is, if the optimum cell width and length is such that a cell fits exactly with the pitch of bit lines and row lines for an open bit line configuration, then the same cell in a folded configuration will cause the bit lines to be longer, with more capacitance, because twice as many row lines must intercept a bit line.

It is the principal object of this invention to provide an improved bit line and cell array structure for high density dynamic RAM devices, particularly MOS devices using one-transistor cells. Another object is to provide a high density dynamic RAM in which the ratio of storage capacitance to bit line capacitance is a maximum, in a folded bit line layout.

SUMMARY OF THE INVENTION

In accordance with one embodiment of the invention, a semiconductor dynamic read/write memory device contains an array of rows and columns of one-transistor memory cells, with a differential sense amplifier for each column of cells. The sense amplifier has a pair of balanced bit lines extending from its inputs, in a quasi-folded bit line configuration. The memory cells are not directly connected to the bit lines, but instead are coupled to bit line segments. The row address selects a cell to be connected to a segment, and also selects one of the two segments to be connected to one of the two bit lines. Instead of being interleaved one-for-one, the word lines for cells to be connected to the two bit lines are in groups for each segment line; the groups are interleaved. The combined segment line and bit line capacitance has a more favorable ratio to the storage capacitance, compared to the one-for-one interleaved layout.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
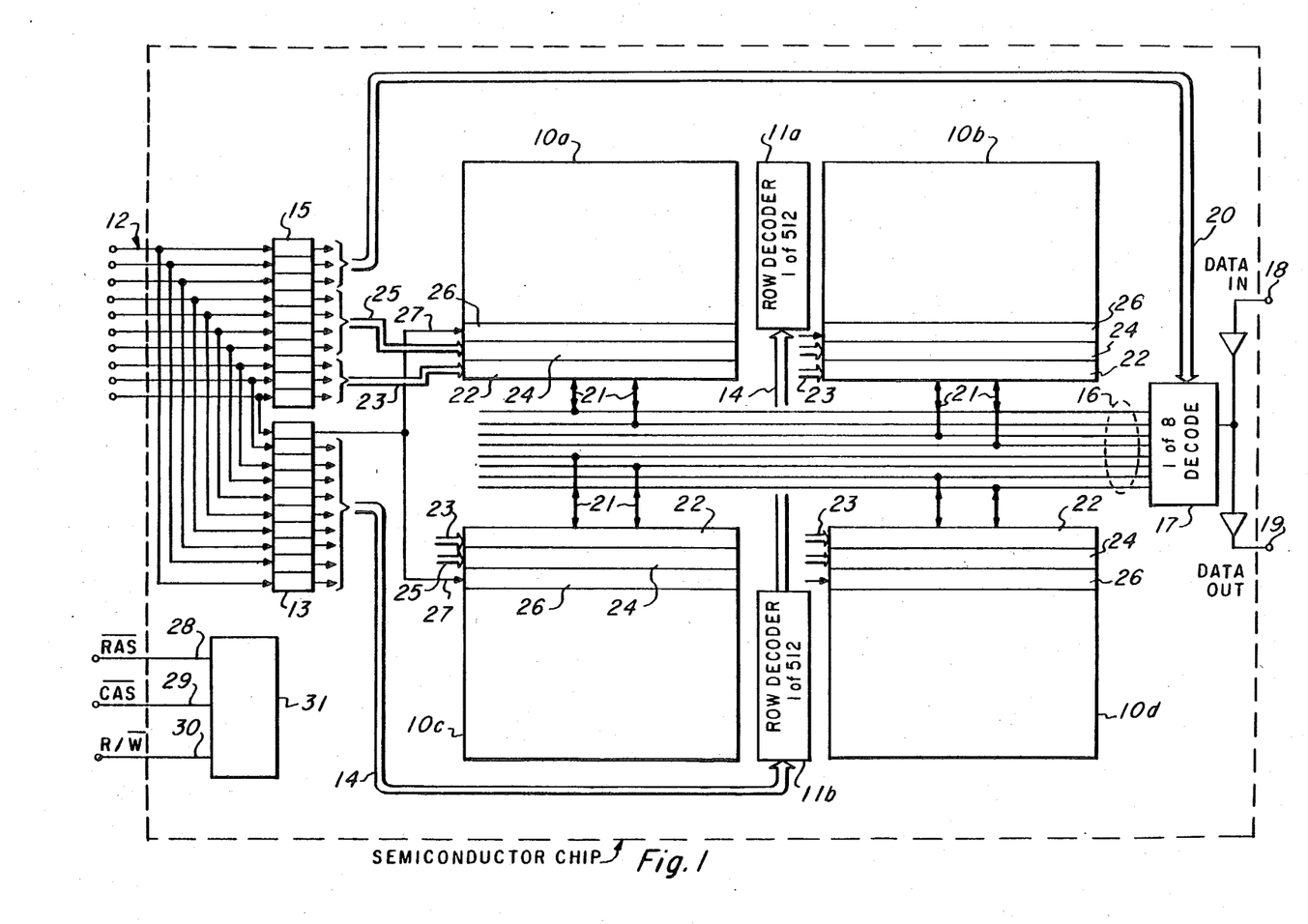
FIG. 1 is an electrical diagram in block form of a dynamic memory device of the 1-Megabit size which may use a quasi-folded bit line configuration, with segmented bit lines in the cell array, according to the invention.

Referring to FIG. 1, a block diagram of one example of a semiconductor read/write memory chip which may use the quasi-folded bit line configuration according to the invention is illustrated. This device is of the so-called 1-Megabit size, having $2^{20}$ or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives 9-bits of a 10-bit row address from address input pins 12 by way of row address latches 13 and lines 14. A 10-bit column address is also applied to the input pins 12, in time-multiplexed manner, and this column address is coupled to buffers 15. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I/O lines 21. A 2-of-16 column selection is made in each of sixteen sets of sixteen intermediate output buffers 24 in each block 10a–10d, using four bits of the column address on lines 25 from buffers 15. Each one of 512 sense amplifiers 26 in each block is connected to one of the columns in the array; each column is made up of two quasi-folded column line halves or "bit lines", with each bit line selectively coupled to a number of bit line segments, according to the invention. Each buffer 24 is coupled to one of two columns; this selection is based on a one bit of the row address from buffers 13 on line 27.

The memory device receives a row address strobe $\overline{RAS}$ on input pin 28, and a column address strobe $\overline{CAS}$ on input pin 29. Selection of a read or a write operation is made by a $R/\overline{W}$ control on an input pin 30. A clock generator and control circuit 31 produces all of the internal clocks and controls as needed.

Each block of the array contains two rows of dummy cells 32 which are selectively coupled to the bit lines in the usual manner, as discussed in the above-mentioned U.S. Pat. Nos. 4,293,993 or 4,081,701.

Figure 2:
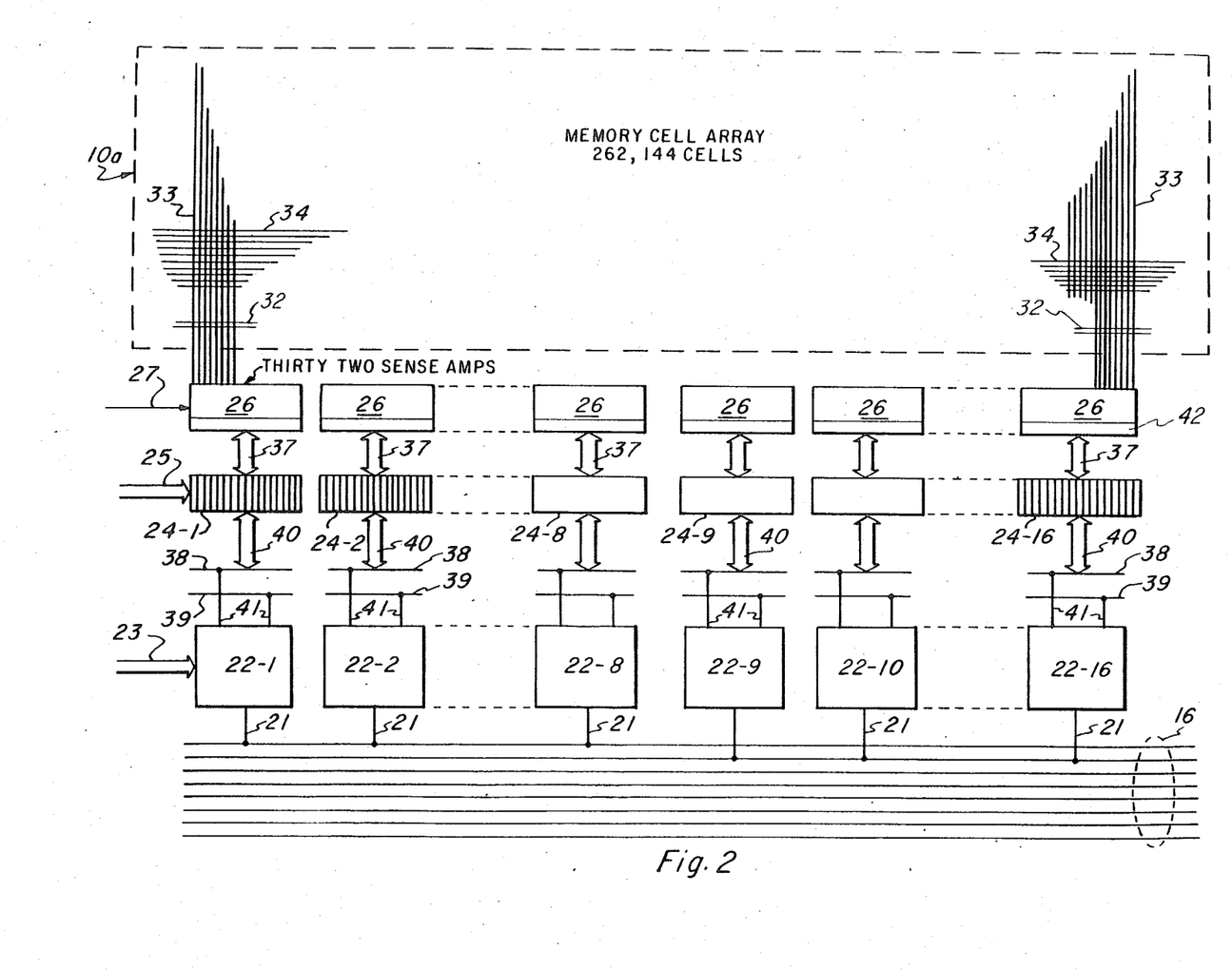
FIG. 2 is an electrical diagram in block form of a part of the memory device of FIG. 1.

Referring to FIG. 2, the I/O lines 16, the first and second level intermediate output buffers 22 and 24, and the sense amplifiers 26 are shown in more detail for a part of one of the blocks 10a–10d. In a given block, there are sixteen of the intermediate output buffers 22, in this figure labelled 22-1 . . . 22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the buffers 22-1 . . . 22-16, there is a set of sixteen buffers 24; here these sets are labelled 24-1 through 24-16 (sixteen in each set). For each set of sixteen buffers 24, a group of thirty-two sense amplifiers 26 is provided, and each sense amplifier 26 is connected to two of the bit lines 33, which in turn are selectively coupled to the bit line segments, as will be explained. Intersecting the bit lines 33 are 512 row lines 34 in the memory cell array. The dummy row lines 32 also intercept the bit lines 33, as will be described. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. Note that the I/O changes from single-rail at the data I/O lines 16 to double rail at the lines 38 and 39 for a write operation.

Figure 3:
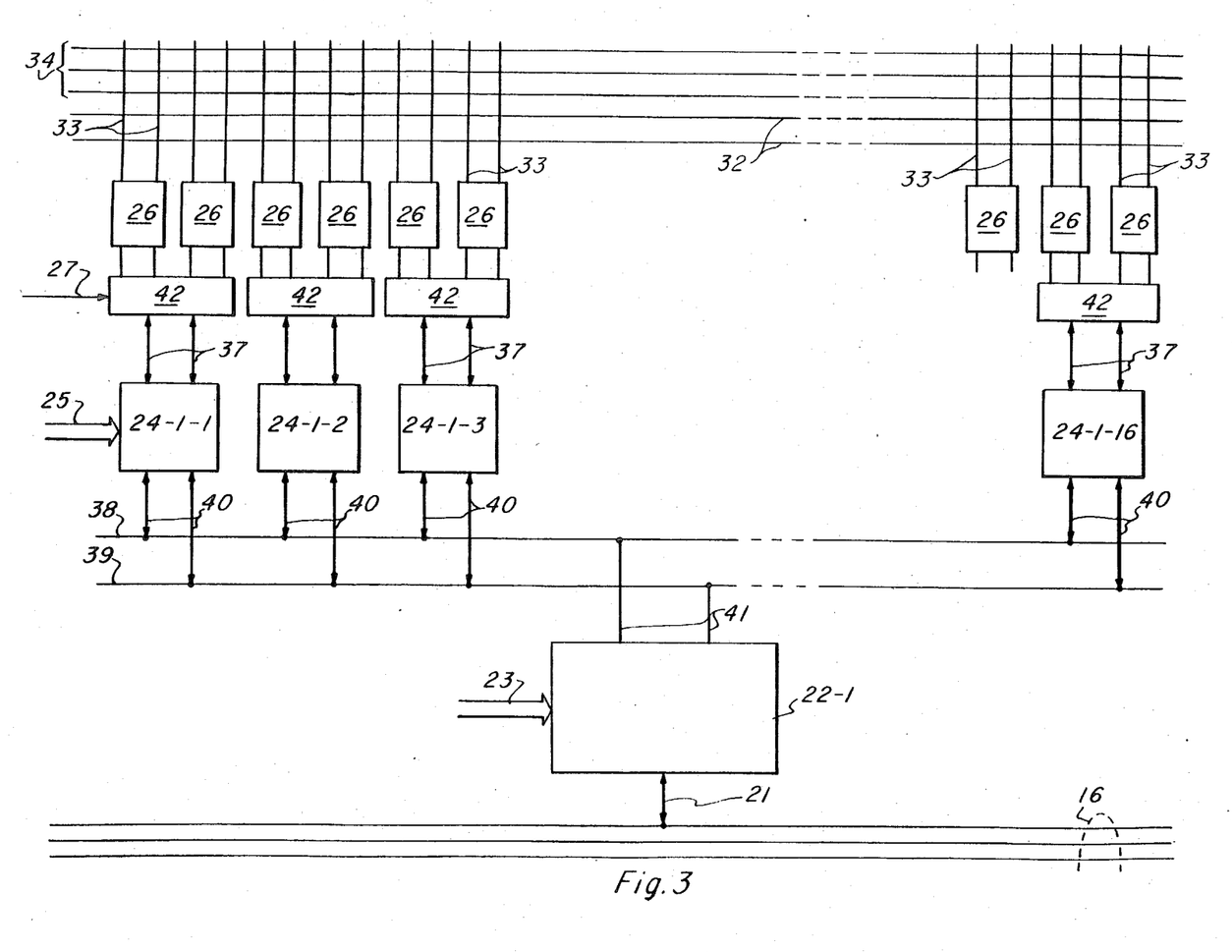
FIG. 3 is an electrical diagram in block form ofr a part of the circuitry of FIG. 2.

Referring to FIG. 3, a part of the circuitry of FIG. 2 is shown in more detail. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense amplifier 26 has two bit lines extending from it, in the so-called folded bit line configuration, and the bit line segments (not shown) run parallel to the bit lines 33. The row lines 34 intersect the bit lines, and memory cells are at intersections of row lines and bit line segments. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operative to couple a read-or-write bit of data to or from the lines 38, 39 by lines 40. The buffer 22-1 of FIG. 3 may or may not be selected by the 2-of-16 select provided by three bits on lines 23, for coupling the dual-rail I/O lines 38, 39 to the single rail I/O line 16 for this group.

Figure 4:
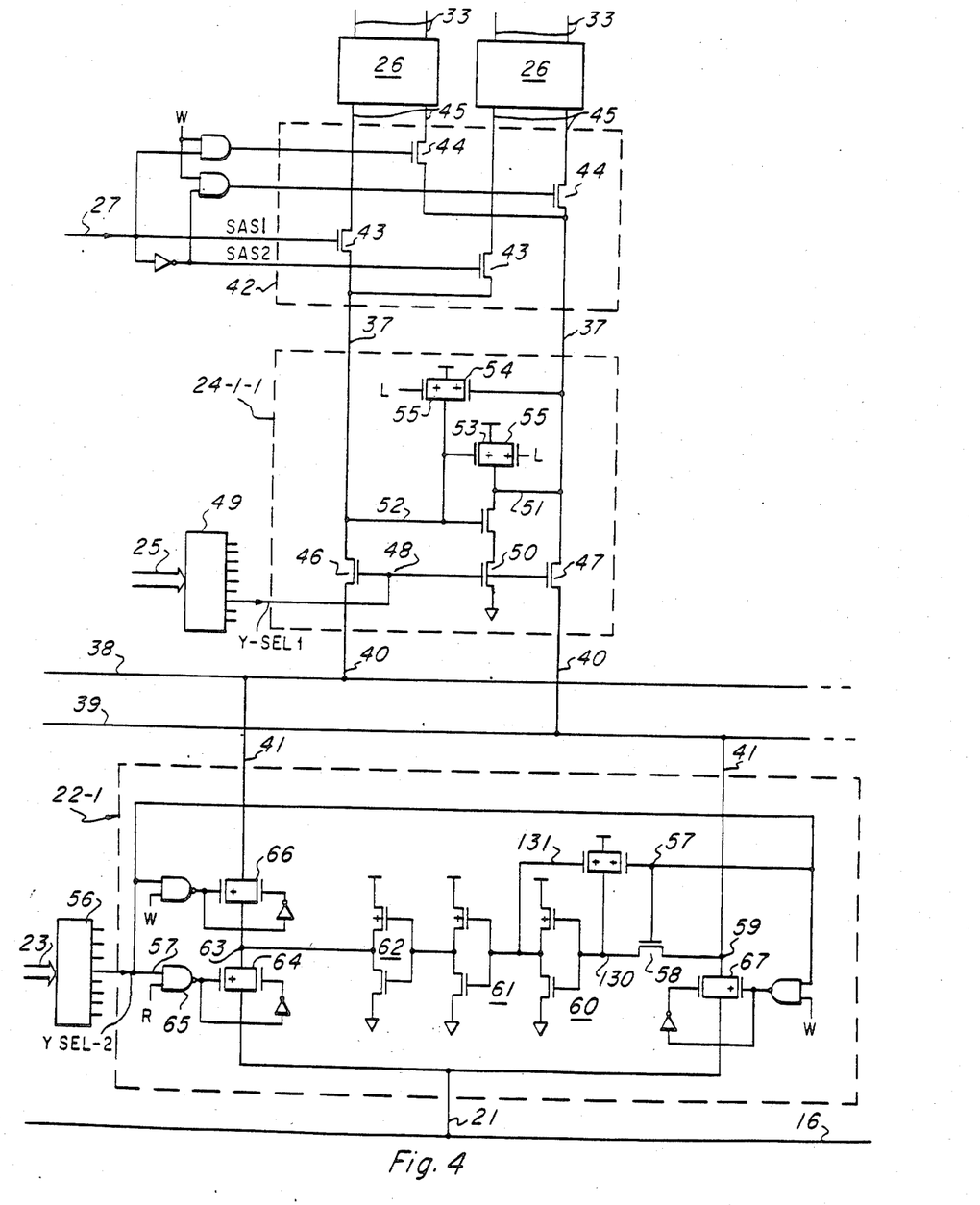
FIG. 4 is an electrical diagram in schematic form of the multiplexers, buffers and column selector circuits of the device of FIG. 3.

Turning now to FIG. 4, a detailed schematic diagram is shown for one of the buffers 24, e.g., the buffer 24-1-1 of FIG. 3, and for one of the buffers 22, e.g., the buffer 22-1. This arrangement of first and second level intermediate I/O buffers is the subject of copending application Ser. No. 626,791, filed July 2, 1984, by by Poteet & Chang, assigned to Texas Instruments. The multiplexer 42 consists of four transistors; one of the two transistors 43 is selected by the address bit on line 27 and its complement, i.e., by the sense-amp-select signals SAS1 and SAS2, so only one of these transistors 43 is on during a read (or write) operation. For read, only one path exists, through the selected one of the transistors 43. For write, one of the transistors 44 is also turned on by the address bit 27 which is Anded with a write control W from the control circuitry 31, valid when the $R/\overline{W}$ control 30 is in the write condition. Thus, the lines 45 which are inputs or outputs of the sense amplifiers 26 are single-ended for read and dual-rail for write; that is, for read operations both of the transistors 44 are off, and only one of the transistors 43 is on, whereas for write operations one transistor 43 and its associated transistor 44 are conductive. The input/output lines 37 for the multiplexer 42 are connected through source/drain paths of transistors 46 and 47 in the buffer 24-1-1 to the lines 38 and 39. The transistors 46 and 47 are controlled by Y-select information on node 48, which comes from a 1-of-16 decoder 49 receiving the 4-bit column address on lines 25. A transistor 50 also is controlled by the Y-select on node 48; this transistor 50 is in series with an inverter transistor which has a P-channel precharge and load circuit. In the single-ended read operation, the inverter functions to place on node 51 the complement of the data bit on node 52, when the buffer 24-1-1 is selected (due to node 48 being high and transistor 50 being on), so the data bit from the selected sense amp is coupled from node 52 through the inverter, node 51, through transistor 47, line 39, to node 59 of the buffer 22-1. Transistor 46 and line 38 have no function during read operations. When node 52 is low, P-channel transistor 53 is on and node 51 is held at the supply voltage Vdd. Likewise, when node 51 is low, P-channel transistor 54 is held on and node 52 is held high. Both nodes 51 and 52 are precharged high by P-channel transistors 55 which receive a low-going precharge voltage L (generated by the circuitry 31) in the precharge cycle after RAS goes high.

The buffer 22-1 in FIG. 4 is controlled by Y-select information from address bits on lines 23 and a 2-of-16 decoder 56, so if this buffer is selected a node 57 is high. This condition turns on a transistor 58 and allows the data on line 39 or node 59 to be amplified through three stages 60, 61 and 62 for driving a node 63. For read, a complementary transistor pair 64 is on, due to a read command R from control circuitry 31 applied to NAND gate 65. That is, when R/W is high, defining a read operation, then R is high and transistors 64 are both on. At this time, complementary transistor pairs 66 and 67 are off because write control W is low. Thus, the data bit on line 39 controls the line 16 through node 59, cascaded inverters 60, 61 and 62, node 63 and transistors 64, for a read operation. On the other hand, for a write operation, the transistor pairs 66 and 67 will be on, and transistor pair 64 will be off, so node 59 (and line 39) will receive the data bit from lne 16 through transistors 67, and node 63 (and lne 38) will receive the complement of this bit, thus converting from single-rail (on line 16) to double-rail (on lines 38, 39) during write. From the lines 38, 39, the dual-rail write data is coupled through both transistors 46 and 47, then through a selected transistor pair 43, 44, to one of the sense amps 26.

Figure 5:
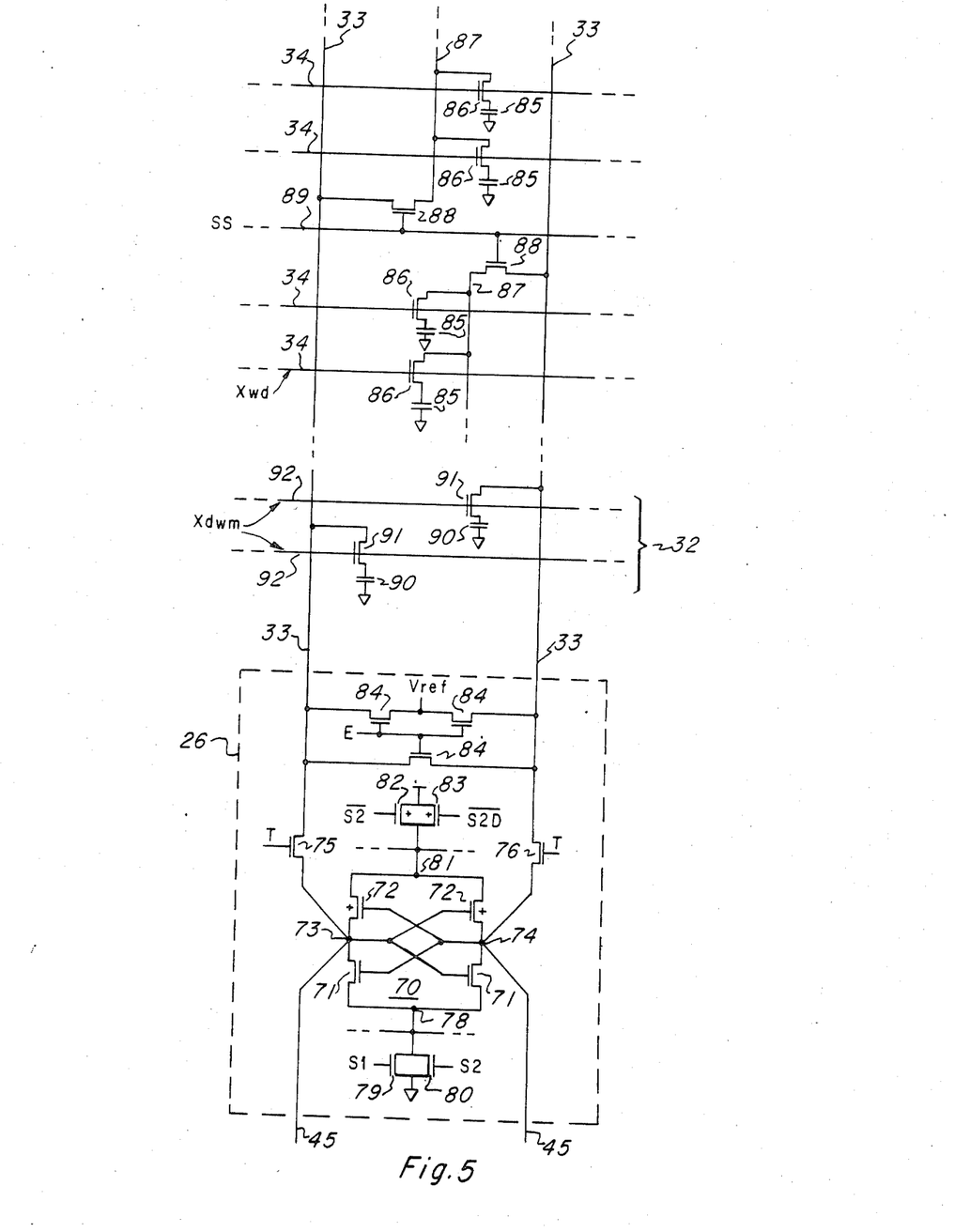
FIG. 5 is an electrical diagram in schematic form of the sense amplifier and cell array of FIGS. 1-4.

Referring to FIG. 5, one of the sense amplifiers 26 is shown in detail. This figure also shows the two bit lines 33 for this sense amplifier and four of the 512 row lines 34 perpendicular to these bit lines, along with two of the bit line segments according to my copending application Ser. No. 636,938, filed herewith. The sense amplifier employs a CMOS cross-coupled flip-flop 70 having N-channel driver transistors 71 and P-channel transistors 72. Sense nodes 73 and 74 are connected to bit lines 33 through the source-drain paths of isolating transistors 75 and 76, as explained in copending application Ser. No. 636,941, filed Aug. 2, 1984, by Charvake Duvrury and Adin Hyslop, assigned to Texas Instruments. A node 78 on the ground side of the flip-flop 70 is coupled to ground through two N-channel transistors 79 and 80 which have sense clocks S1 and S2 on their gates. The transistor 79 is much smaller than the transistor 80, and clock S1 occurs first, so the initial sensing is at a lower-gain condition, and is performed by N-channel transistors 71. On the Vdd side, a node 81 is coupled to the supply through P-channel transistors 82 and 83, one of which has sense clock $\overline{S2}$ on its gate and the other a delayed $\overline{S2D}$ on its gate. The sense clock $\overline{S2}$ is the complement of S2, so the P-channel transistors 72 start to operate only after the second clock S2 is activated. There is a two-interval sense operation, first S1, then S2 and $\overline{S2}$. The transistor pairs 79,80 and 82,83 are shared with all of the other sense amplifiers 26 in two blocks 10a and 10b, i.e., 1024 sense amplifiers. The nodes 78 and 81 are precharged to Vref, about one-half Vdd by transistors (not shown) connected to the common lines when E is high.

The bit lines 33 are precharged and equalized through three transistors 84 which have an equalize clock signal E on their gates; two of these transistors 84 have their sources connected to the reference voltage Vref. The value of this reference voltage is about half Vdd, so little or no net charge is needed from the chip supply Vdd to precharge all of the bit lines. That is, one line 33 will be high and the other low for each sense amplifier after an active cycle, so one will charge the other, and Vref need only supply any differential that might have occurred. The clock E is generated in the control circuitry 31 after the end of an active cycle, after $\overline{RAS}$ goes high.

Each one of the memory cells consists of a capacitor 85 and an access transistor 86. There are 512 cells for each column, i.e., associated with a pair of bit lines 33.

Also, there are 512 cells for each row, i.e, associated with each row line 34. The gates of all of the 512 access transistors 86 in a row are connected to (or formed by) a row line 34. Only one row line 34 of the 512 in the block is turned on at any one time, so only one memory cell capacitor 85 is selected. According to my copending application Ser. No. 636,941, the selected cell is connected to a bit line 33 through a bit line segment 87. In order to reduce the ratio of the bit line capacitance to the value of the storage capacitance 85, a number of bit line segments 87 are employed for each pair of bit lines 33. Two of these segments 87 are coupled to opposite bit lines 33 at a given time by two transistors 88. For example, each segment 87 may have thirty-two cells connected to it, so in the embodiment disclosed herein there must be sixteen of these segments 87 for each sense amplifier ($16 \times 32 = 512$). The row decoder 11a or 11b selects the appropriate one of eight lines 89 by applying a segment select voltage SS to the selected line 89, at the same time as this decoder selects 1-of-512 row lines 34, based on certain ones of the same nine address bits from lines 14. When a line 89 goes high, two segments 87 are connected to bit lines 33, one on each side by the two transistors 88, but only one of these segments 87 will have an activated row line 34 on it, so only one memory cell is coupled to a bit line 33.

In the dummy rows 32, a pair of dummy cells are provided for each pair of bit lines 33, and these dummy cells consist of dummy capacitors 90 and access transistors 91. When the selected storage cell is coupled to the left-hand bit line 33 via selected segment 87 and transistor 88, then the right-hand dummy cell is selected in the row decoders 11a, 11b by one of the decoder output lines 92, and vice versa. One bit of the row address is used in the row decoder to select one or the other of these lines 92 of the dummy cell rows 32.

Figure 6:
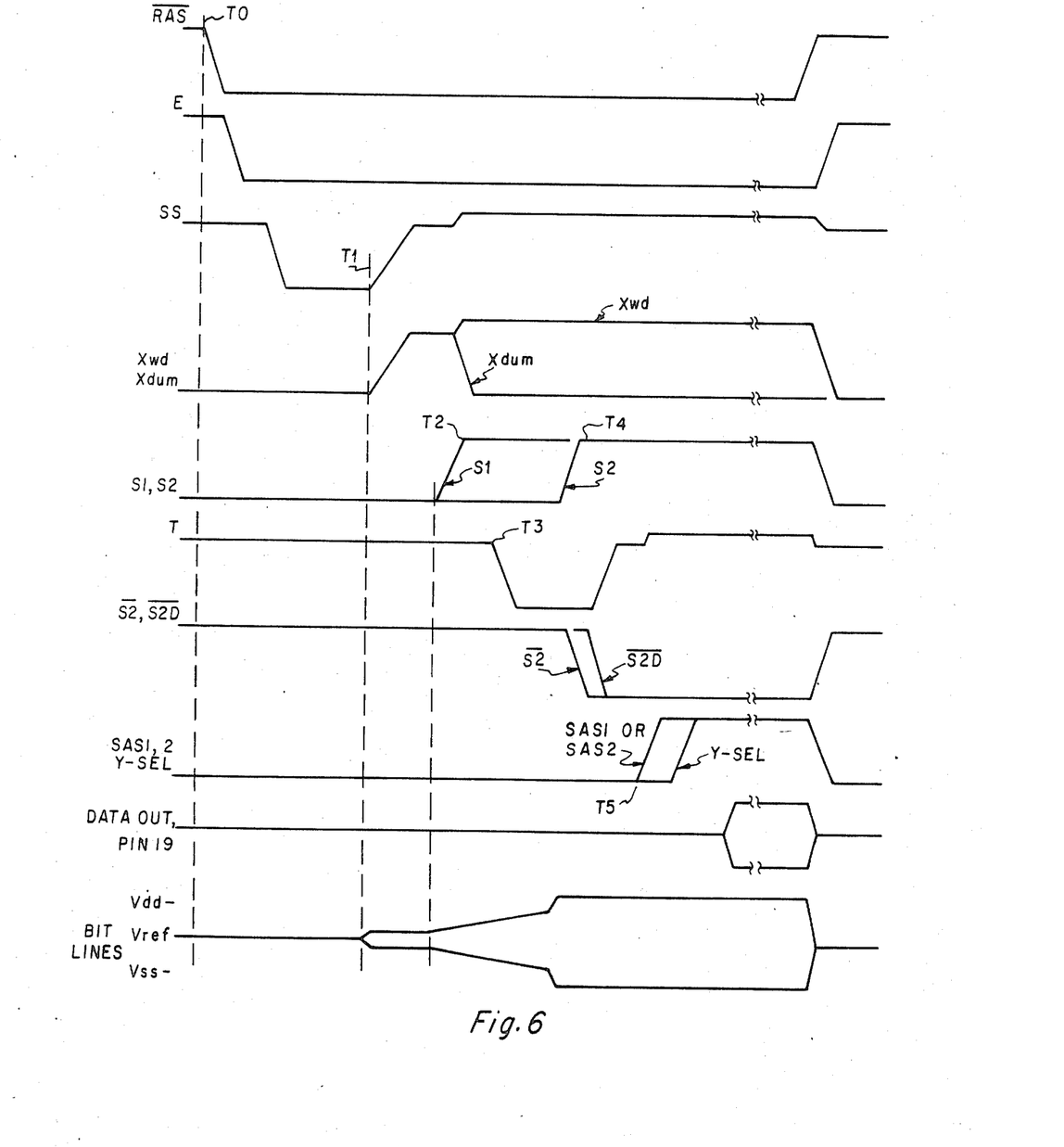
FIG. 6 is a timing diagram showing voltage vs. time for various nodes in the circuit of FIGS. 1-5.

Referring to FIG. 6, the sequence of operation of the memory device will be explained for a single-bit read operation. An active cycle begins with the $\overline{RAS}$ voltage dropping from +5 to zero at the time TO. This example is a read cycle, so at time TO the R/W input voltage is at +5. The time prior to TO is a precharge cycle, during which the equalize signal E has been high, so all of the bit lines 33 and the nodes 78 and 81 have been precharged to the Vref voltage, assumed to be about ½ Vdd or +2.5. The segment select signal SS on all lines 89 is also held high during the precharge cycle, so all of the segments 87 are also precharged to the Vref voltage. The dropping of $\overline{RAS}$ at TO causes the equalize voltge E to drop, isolating the pairs of bit lines 33 from each other and from Vref. The segment select voltage SS then drops, isolating all of the segments 87 from the bit lines 33. As soon as the row decoders 11a, 11b have had time to respond to the row address, the Xwd and Xdum voltages start to rise on the selected 1-of-512 row line 34 and selected 1-of-2 dummy line 92; at the same time, the segment-select signal on one of the lines 89 is brought up at T1. These address voltages Xwd, Xdum and SS are brought up rather slowly, and, after reaching the Vdd level, Ss and Xwd are boosted above Vdd to eliminate the Vt drop across the access tranistors 86 and 88. The Xdum voltage falls, since the function of the dummy cells is completed during initial sensing, and the dummy capacitors can be decoupled from the bit lines so that precharge of these capacitors can begin as disclosed in copending application Ser. No. 630,50700, filed July 11, 1984 by Tran, McAdams and Childers, assigned to Texas Instruments. At time T2, the sense amplifiers 26 are first activated by the S1 voltage going high, turning on the high-impedance N-channel transistor 79; this begins to separate the bit lines 33 further than the separation caused by the differential voltages on the storage cell and dummy cell. But before any current flows from the supply Vdd through transistors 72, the T voltage falls at T3, isolating the bit ines 33 from the sense nodes 73 and 74. After the T voltage falls, the sense voltage S2 is brought up, so the large tranistor 80 begins to conduct; also $\overline{S2}$ drops, so one P-channel transistor 82 begins to conduct. After a slight delay $\overline{S2D}$ falls, and the other P-channel transistor 83 begins to conduct. After S2 rises and $\overline{S2}$ drops at T4, the T voltage is brought up to Vdd. At time T5 after the isolating transistors 75, 76 have been turned back on, sensing is complete and one bit line 33 is high and the other at zero, so the sense-amp-select signal SAS1 or SAS2 is turned on, connecting one of the bit lines to the node 52 via lines 45 and 37 of FIG. 4. Just after this the Ysel-1 and Ysel-2 outputs from decoders 49 and 56 are valid at nodes 48 and 57, so the selected data bit becomes valid on the line 16, and shortly thereafter valid on the output pin 19.

Figure 7:
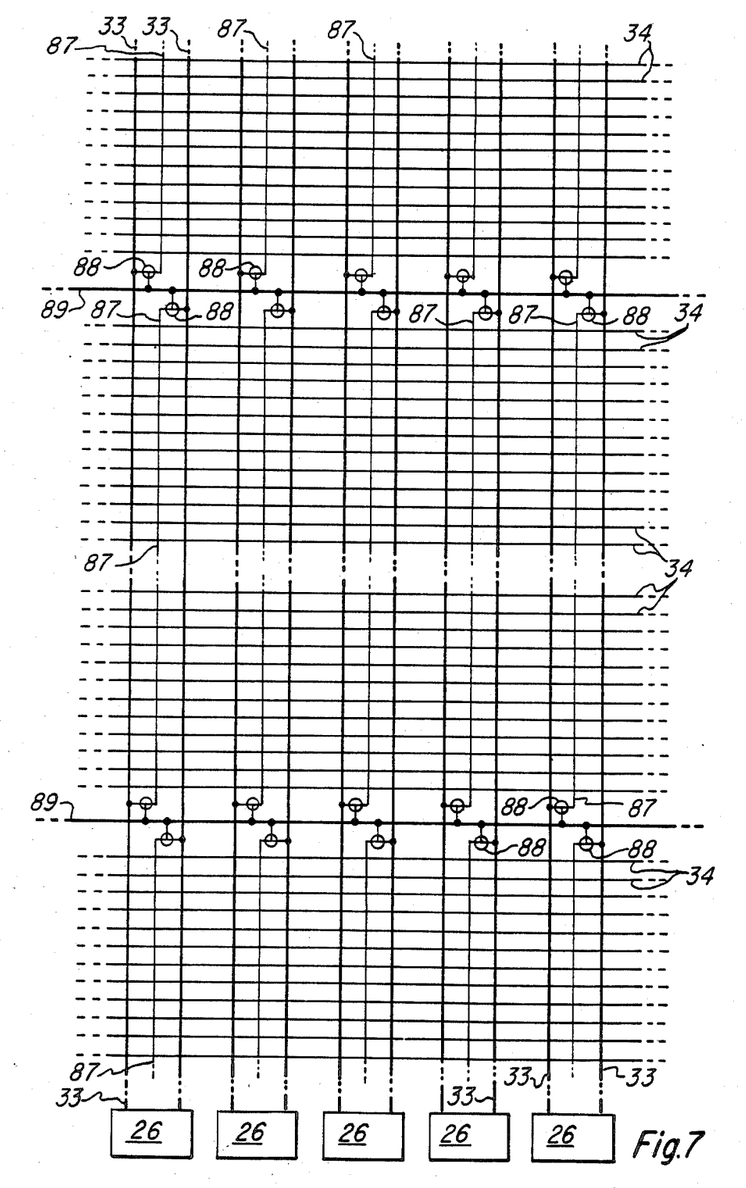
FIG. 7 is an enlarged view of a small part of the cell array showing the quasi-folded bit line configuration of the invention.
Figure 8:
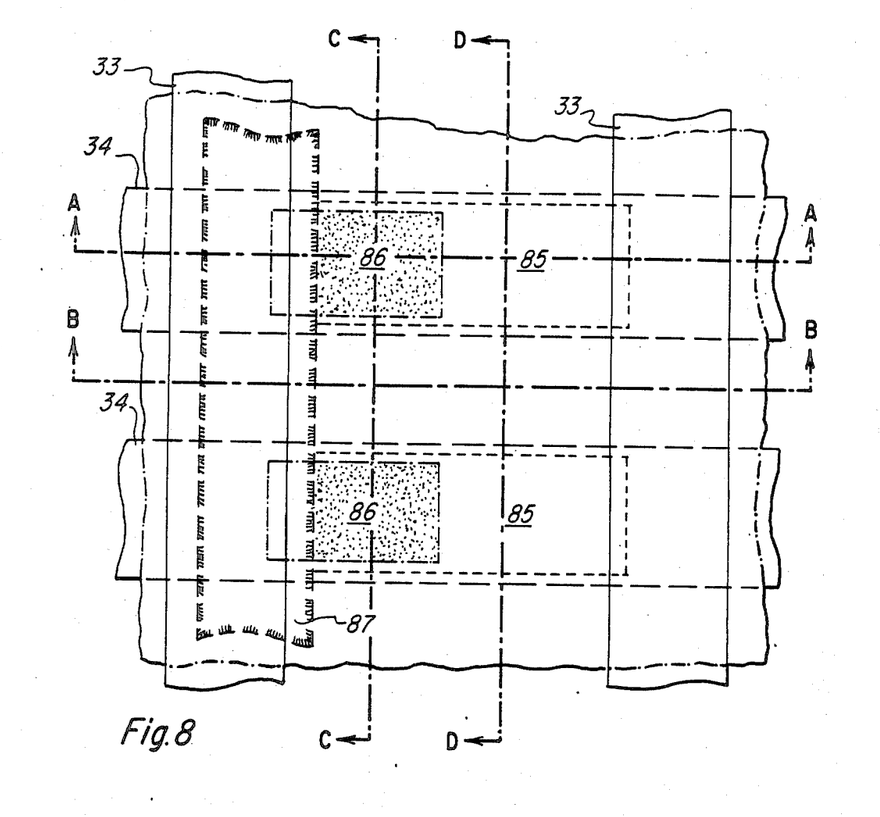
FIG. 8 is a plan view, greatly enlarged, of a very small part of the cell array in the device of FIGS. 1-7 showing two memory cells.
Figure 9:
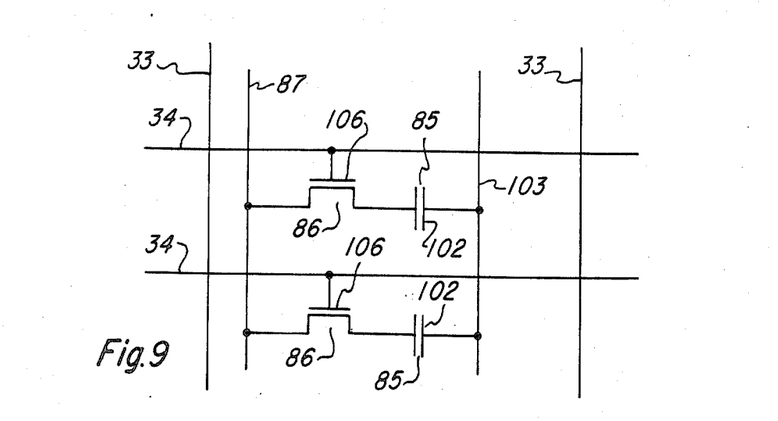
FIG. 9 is an electrical schematic diagram of the two cells of FIG. 8.
Figure 10A:
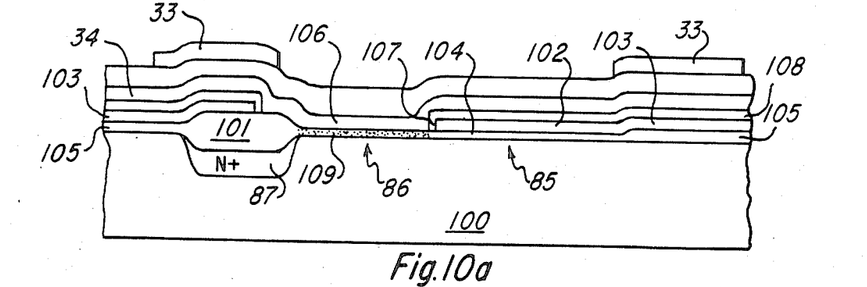
FIGS. 10A-10D are elevation views in section of the device of FIG. 8, taken along the lines A—A through D—D, respectively.
Figure 10B:
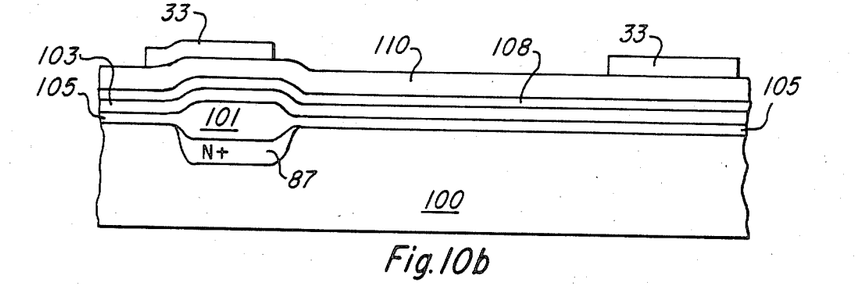
Figure 10C:
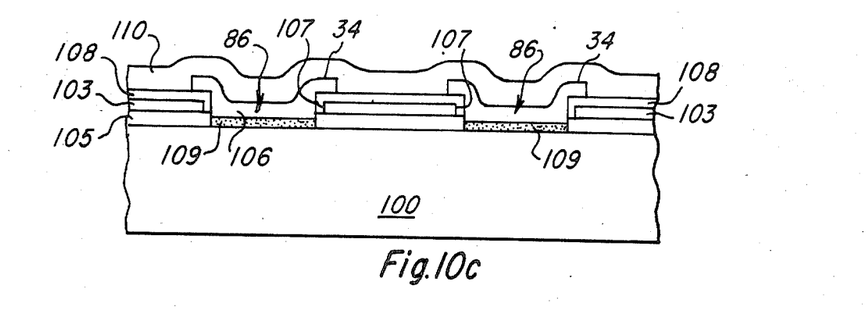
Figure 10D:
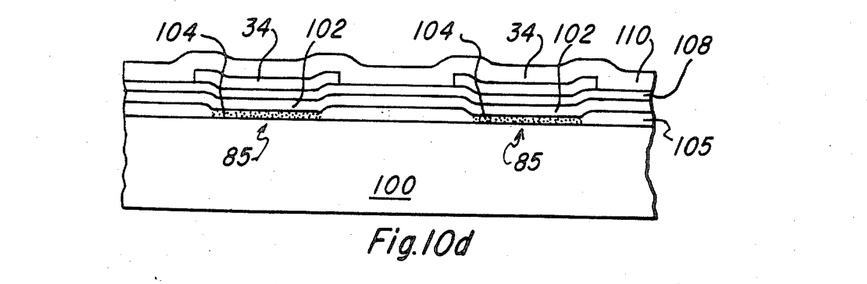

With reference to FIG. 7, a small part of one block of the cell array is illustrated. Each of the segment lines 89 is connected in common to all of the transistors 88 in a row, but a cell on a given segment 87 sees only the parasitic capacitance of that one segment line, plus that of one bit line 33. The advantage of using the segmented bit lines is that the parasitic capacitance of the bit lines 33 is much less than that of the segments 87; this is because the bit lines 33 are composed of metal strips separated from the substrate by a thick insulator coating, whereas the segments 87 are N+ regions within the substrate itself, as will be shown in FIGS. 8 and 10A-10D. Thus, even though the length of the bit line 33 to which the selected capacitor 85 is coupled is as long as if the segmenting had not been used, nevertheless the capacitance ratio factor is greatly improved. Only one-thirty-secondth the amount of high-capacitance segment line is seen by a given storage cell, compared to using a full-length N+ bit line, and the metal bit ine 33 has perhaps only one-tenth the capacitance of an N+ diffused bit line. Also, the number of metal-to-silicon, or metal-to-poly, contacts per bit line or per row line is reduced to merely that of the number of transistors 88, since a "contactless" cell layout can be used.

One example of the one-transistor cell structure which may be used with the quasi-folded bit lines of the invention, along with the segmented bit lines, is shown in FIGS. 8, 9, and 10A-10D. The memory device of FIGS. 1-7 is formed in a single silicon substrate 100 which would be about 180×500 mils in size, and about 15 mils thick. The small part shown in FIGS. 8, 9 and 10A-10D is only about 5×5 microns. The word lines 34 are molybdenum strips extending above the face of the substrate 100, and the bit line segments 87 are elongated N+ regions in the substrate buried under thick thermal oxide 101. The capacitors 85 have upper plates 102 which are parts of a grounded polysilicon field plate 103 extending across the entire cell array. The silicon oxide 104 beneath the capacitor plate 102 is thinner than the insulator 105 beneath the other areas of the field plate 103. The gate 106 of a transistor 86 is formed by a part of the word line 34 where it extends into a hole 107 in the field plate 103. An oxide coating 108 covers the polysilicon field plate 103, insulating it from the word lines 34 and tranistor gates 106. A thin silicon oxide layer 109 is the gate insulator for the transistor. A thick layer 110 of deposited oxide or phosphosilicate glaze separates the aluminum lines 33 from the word lines 34; it is the thickness of this layer 110 which causes the parasitic capacitance of the bit lines to be small, compared to that of the N+ segment lines 87. Every thirty-two cells there is a metal-to-silicon contact (not shown) between the metal lines 33 and an N+ region in the substrate 100 to contact the drain of a transistor 88; this contact is at a hole in the thick insulator 110 and field plate 103. Note, however, that no contacts are needed for the cells, only for the segment lines. The pitch of the word lines 34 and the pitch of the bit lines 33 is therefore determined by the shape of the cell capacitor and transistor, rather than the contacts.

Although the embodiment disclosed herein is a dynamic read/write memory, features of the invention are applicable to read-only memories such as ROMs or EPROMs, as well as other read/write memories such as static RAMs.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor memory device comprising:
   an array of rows and columns of memory cells, each column having a pair of balanced bit lines connected to memory cells of the columns, each memory cell in a row having a control input connected to a row line for the row of cells,
   a plurality of differential sense amplifiers, each sense amplifier having a pair of inputs coupled to said pair of bit lines of a different one of said columns, said pair of bit lines both being physically located on the same side of the sense amplifier in a folded bit line configuration,
   said memory cells in a column being partitioned in a plurality of groups of adjacent cells, each one of said groups containing a plurality of said cells, all of the cells in each group being coupled to the same bit line of the pair, the cells in alternate ones of said groups along the pair of bit lines being connected to alternate ones of said pair of bit lines.

2. A device according to claim 1 wherein each group contains the same number of cells, and the same number of cells is coupled to each of said bit lines.

3. A device according to claim 2 wherein said memory cells are read/write memory cells.

4. A device according to claim 3 wherein said memory cells are dynamic one-transistor cells, each containing an access transistor and a storage capacitor.

5. A device according to claim 4 wherein said control input is the gate of said access transistor in each cell.

6. A device according to claim 5 wherein the memory device is an integrated circuit formed in a face of a semiconductor body, and said bit lines are conductive strips overlying said face and insulated therefrom by a relatively thick insulator coating.

7. A device according to claim 6 wherein cells in each group are selectively coupled to one of a plurality of segment lines extending along said face parallel to said bit lines.

8. A device according to claim 7 wherein segment lines are heavily-doped regions of the semiconductor material of said face.

9. A device according to claim 8 wherein the parasitic capacitance per unit length of one of said bit lines is less than the parasitic capacitance per unit length of one of said segment lines.

10. A device according to claim 2 wherein each group contains at least eight cells.

11. A device according to claim 10 wherein there are at least eight groups.

12. A semiconductor dynamic read/write memory device comprising:
- an array of rows and columns of one-transistor read/write memory cells formed in a face of a semiconductor body each column having a pair of balanced bit lines connected to memory cells of the columns, each memory cell in a row having an access transistor with a gate connected to a row line for the row of cells,
- a plurality of differential sense amplifiers, each sense amplifier having a pair of inputs coupled to said pair of bit lines of a different one of said columns, said pair of bit lines both being physically located on the same side of the sense amplifier in a folded bit line configuration,
- said memory cells in a column being positioned in an even number of groups of adjacent cells, each group containing a plurality of memory cells, the source-to-drain paths of the access transistors of all of the cells contain within each group being coupled to the same one of the bit lines of the pair, the cells in alternate groups being connected to alternate ones of said pair of bit lines.

13. A device according to claim 12 wherein each group contains the same number of cells, and the same number of cells is coupled to each of said bit lines.

14. A device according to claim 13 wherein said bit lines are conductive strips overlying said face and insulated therefrom by a relatively thick insulator coating.

15. A device according to claim 14 wherein said cells in each group are selectively coupled to one of a plurality of segment lines extending along said face parallel to said bit lines.

16. A device according to claim 15 wherein said segment lines are heavily-doped regions of the semiconductor material of said face.

17. A device according to claim 16 wherein the parasitic capacitance per unit length of one of said bit lines is less than the parasitic capacitrance per unit length of one of said segment lines.

18. A device according to claim 13 wherein said row lines are also in groups, and all row lines in a group of row lines are connected to said gates of access transistors for all cells in the same group of memory cells.

19. A device according to claim 18 wherein each group contains at least eight cells.

20. A device according to claim 19 wherein there are at least eight groups.

* * * * *